United States Patent [19]

Scott et al.

[11] Patent Number: 5,451,553
[45] Date of Patent: Sep. 19, 1995

[54] SOLID STATE THERMAL CONVERSION OF POLYCRYSTALLINE ALUMINA TO SAPPHIRE

[75] Inventors: Curtis E. Scott, Mentor, Ohio; Lionel M. Levinson, Schenectady, N.Y.; Randolph E. Maxwell, Chesterland; Mary S. Kaliszewski, Cleveland Heights, both of Ohio

[73] Assignee: General Electric Company, Schenectady, N.Y.

[21] Appl. No.: 126,954

[22] Filed: Sep. 24, 1993

[51] Int. Cl.⁶ ............................................. C30B 1/02
[52] U.S. Cl. ........................... 501/86; 501/127; 501/153; 117/4; 117/7; 313/493; 313/636
[58] Field of Search ................. 501/86, 127, 153; 156/603, DIG. 61, DIG. 73; 117/3, 4, 7, 11; 313/493, 636

[56] References Cited

U.S. PATENT DOCUMENTS

| | | | |
|---|---|---|---|
| 988,230 | 3/1911 | Verneuil | 501/86 |
| 3,026,210 | 3/1969 | Coble | 501/153 |
| 3,382,047 | 5/1968 | Holtzberg et al. | 117/10 |
| 3,943,324 | 3/1976 | Haggerty | 219/121.63 |
| 3,998,686 | 12/1976 | Meiling et al. | 117/33 |
| 4,150,317 | 4/1979 | Laska et al. | 313/631 |
| 4,285,732 | 8/1981 | Charles et al. | 501/101 |
| 4,444,615 | 4/1984 | Matzsuzawa et al. | 117/6 |
| 4,519,870 | 5/1985 | Matzsuzawa et al. | 117/7 |
| 4,900,393 | 2/1990 | Kugimiya et al. | 117/10 |

FOREIGN PATENT DOCUMENTS

| | | | |
|---|---|---|---|
| 2021794 | 1/1987 | Japan | 501/86 |
| 62-28118 | 6/1987 | Japan . | |
| 2278198 | 12/1987 | Japan | 501/86 |

OTHER PUBLICATIONS

"Alumina: Sintering and Optical Properties", J. G. J. Peelen, PhD Thesis Technical University of Eindhoven, Netherlands, May 1977.

*Primary Examiner*—Karl Group
*Assistant Examiner*—David Sample
*Attorney, Agent, or Firm*—Stanley C. Corwin

[57] ABSTRACT

A solid state process for the bulk conversion of a dense polycrystalline ceramic body to a single crystal body has been accomplished by heating the polycrystalline material to a temperature above one-half of the melting temperature of the material but below the melting point of the material. As the process is a solid state process, no melting of the ceramic body is necessary to convert it to a single crystal. The process has been used to convert a dense polycrystalline alumina body (PCA) containing less than 100 wppm of magnesia to sapphire (single crystal alumina) by heating the PCA to temperatures above 1100° C. but below 2050° C., the melting point of alumina.

22 Claims, 3 Drawing Sheets

SOLID STATE THERMAL CONVERSION OF POLYCRYSTALLINE ALUMINA TO SAPPHIRE

BACKGROUND OF THE INVENTION

1. Related Applications

This application is related to copending applications entitled "Solid State Formation of Sapphire Using a Localized Energy Source", Ser. No. 08/064,386 (LD 10498), filed May 21, 1993; "Solid State Thermal Conversion of Polycrystalline Alumina to Sapphire Using a Seed Crystal", Ser. No. 08/126,628, filed Sep. 24, 1993; and "Conversion of Polycrystalline Material to Single Crystal Material Using Bodies Having a Selected Surface Topography", Ser. No. 08/126,830, filed Sep. 24, 1993, the latter two applications filed concurrently herewith, all of which are assigned to the assignee of the present invention.

Another related copending application is Ser. No. 08/195,187 filed Feb. 14, 1994 entitled "Conversion of Doped Polycrystalline Material to Single Crystal Material."

2. Field of the Invention

This invention relates to a solid state process for bulk conversion of a polycrystalline ceramic body to a single crystal body by heating the polycrystalline body to temperatures above one-half the melting temperature of the material but below the melting temperature of the material. More particularly, this invention relates to a solid state process for the bulk conversion of polycrystalline alumina (PCA) to a single crystal alumina (sapphire). The solid state conversion of PCA to sapphire is accomplished by heating a PCA body containing less than 100 wppm of magnesia to a temperature above 1100° C. but below 2050° C., the melting point of alumina. No melting of the PCA body is necessary to obtain the conversion.

3. Background of the Invention

The manufacture of Lucalox ® alumina, a type of polycrystalline alumina (PCA), and its use for high pressure sodium arc discharge lamps (hereinafter "HPS lamps") is well known and old to those skilled in the art. U.S. Pat. Nos. 3,026,210; 4,150,317 and 4,285,732, respectively, to Coble, Laska et al and Charles et al, disclose the production of a high density PCA body having improved visible light transmittance using relatively pure alumina powder and small amounts of magnesia. U.S. Pat. No. 4,285,732 further teaches adding zirconia and hafnia to the magnesia-doped alumina to reduce the chances of precipitating a second phase and exaggerated or run away grain growth during sintering. PCA bodies useful for HPS lamps have been made according to the process in these patents having an average grain size ranging between 15 microns to 100 microns. Two major drawbacks associated with the use of PCA arc tubes for HPS lamps are firstly that they are light translucent as opposed to light transparent and secondly, that the sodium in the arc reacts with the alumina at the PCA grain boundaries to form sodium aluminate, which shortens lamp life. HPS lamps are being designed for increased sodium partial pressure within the PCA arc tube to improve the color rendition and provide a whiter emitted light. However, higher sodium pressure further shortens lamp life due to sodium loss from the arc chamber. Progressive sodium loss results in a rise in the lamp operating voltage, a decrease of both correlated color temperature and color rendering index, and a color shift from white to pink. Also, the sodium which migrates through the arc chamber wall deposits on the inside wall of the evacuated outer lamp envelope causing a brownish stain on the envelope which, in turn, further reduces the light output of the lamp. These problems are substantially reduced with sapphire (i.e., single crystal alumina) arc tubes.

Sapphire arc tubes useful as the arc chamber for HPS lamps have been made by number of processes, including a modified Czochralski process known as the edge-defined, film-fed growth (EFG) process developed by Tyco Laboratories, Inc. This process uses a seed crystal and a die on the surface of molten alumina in which a hollow tube is continuously pulled out of the melt through a die. This process is expensive and slow. Another process used to produce single crystal alumina (sapphire) is called the floating zone process. In this process, a PCA rod is introduced at a predetermined velocity into a heating zone wherein one or more lasers, or other concentrated heat source, are focused on the rod to melt the alumina, forming a melt zone. A sapphire fiber is continuously drawn from the melt zone at desired velocity and the feed rod is moved simultaneously, but at a slower rate so that the process is a continuous one. This process is used primarily to produce sapphire fibers and does not readily lend itself to production of single crystal alumina tubing, although its use for such is disclosed in U.S. Pat. No. 3,943,324.

Published Japanese Patent Application 62-28118 of H. Yoshida et al, discloses that sapphire can be synthesized via a solid state process by inducing a magnesia concentration gradient along the length of a PCA body to ensure grain growth is initiated from a single point on the PCA body during the heat treatment to produce a single crystal body. This magnesia gradient can be produced in the PCA body by doping the green body with magnesia in such a way that there is a magnesia gradient in the PCA body or by using a temperature gradient to create the magnesia concentration gradient, or by machining a thin section on the green body. Key to the Yoshida et al process is that the growth of the single crystal initiates from a single location in the polycrystalline body. The Yoshida et al disclosure, taken at face value, appears not to be workable. In particular, Yoshida et al require only the equivalent of 90 wppm (weight parts per million) magnesia in their alumina starting body. Yet, in order to realize a dense PCA structure, at least about 300 wppm of magnesia is required. (Note "Alumina: Sintering and Optical Properties", J. G. J. Peelen PhD Thesis, Technical University of Eindhoven, Netherlands, May 1977.) Typical conversion processes, such as those used to manufacture Lucalox ®, have 550–750 wppm magnesia in the alumina starting body to ensure full density is achieved. At 90 wppm of magnesia, a dense, pore-free structure, specified by Yoshida et al as their starting material, cannot be achieved.

SUMMARY OF THE INVENTION

A solid state process has now been discovered for converting a polycrystalline ceramic material to a single crystal material and particularly for converting polycrystalline alumina to single crystal alumina (hereinafter "sapphire"). By solid state process is meant that the conversion of the polycrystalline body to a single crystal occurs at a temperature sufficiently below the melting temperature of the material such that no part of the polycrystalline article melts, nor is there any molten zone formed in the article during any of the heating steps. Instead, the conversion of the polycrystalline material to sapphire occurs as a solid state process. This solid state conversion process allows for simple or complex ceramic shapes to be fabricated using standard polycrystalline forming techniques and then converted into a single crystal body without melting the body. Thus, the single crystal body maintains the shape of the polycrystalline precursor. This process will allow for much greater diversity fabricating single crystal shapes than is currently available using conventional melt drawing or floating zone techniques.

Unlike the process described in Japanese Patent Publication 62-28118, the process of this invention does not require the development of a magnesia gradient or crystal growth initiation from a single site. In making sapphire from a PCA body according to the process of this invention, a PCA body of relatively pure alumina having a magnesia content less than 100 wppm, an equiaxed grain structure with average grain sizes less than 70 µm, and a density greater than 3.9 g/cc was heated to temperatures greater than 1100° C. (approximately one-half the melting point of alumina) but below 2050° C., the melting point of alumina. Magnesia contents of 100 wppm or less are required, we believe, to ensure that all of the magnesia is in solid solution with the alumina and not segregated at the grain boundaries where it would act to inhibit boundary mobility.

Twenty-four inch PCA tubes, heat treated according to the process of this invention, generally contain one or more regions of sapphire in excess of six inches long. Multiple regions of sapphire along the length of the tube result from crystal growth initiation from multiple sites along the tube. Sapphire fibers have also been produced using the process of this invention.

Sapphire tubes produced according to the process of this invention exhibited total and forward diffuse visible light transmittance comparable to commercially available sapphire, as shown in Table 1. Sapphire produced according to the process of this invention is suitable for use as an arc tube for high pressure sodium lamps (HPS) lamps, such as the one shown in FIG. 1. Use of this material in HPS lamps has resulted in a 10–15% increase in lamp efficacy over lamps with Lucalox ® (PCA) arc tubes.

TABLE 1

|  | Transmittance | |
|---|---|---|
|  | Total | Forward Diffuse |
| Standard Lucalox ® PCA[1] | 96 | 70 |
| Sapphire (from this invention) | 98 | 87 |
| Sapphire (commercial[2]) | 97 | 87 |
| Sapphire (commercial[3]) | 97 | 87 |

[1]General Electric Company, Willoughby Quartz and Ceramic Plant, Willoughby Ohio
[2]Saphikon, Inc., Milford, New Hampshire
[3]Kyocera, Kyoto, Japan Sapphire produced according to the process of this invention is distinguished from sapphire fabricated using such processes as EFG or Czochralski, or U.S. Pat. No. 3,943,324 by the combination of a random pore arrangement and a unique surface topography in the form of slight undulations having high points at approximately the midpoint of where each PCA grain was prior to the conversion and depressed areas corresponding to where the grain boundaries were prior to conversion. Typical surface topography is illustrated in FIG. 2. Sapphire material made by such melt drawing techniques as EFG or Czochralski has a linear arrangement of porosity resulting from bubbles produced during the drawing process. None of the above-mentioned processes exhibits the surface topography observed in sapphire fabricated by the process of this invention.

DETAILED DESCRIPTION

In the practice of this invention for the solid state conversion of PCA to sapphire, it has been found useful that the starting PCA material should be a relatively pure sintered alpha alumina; in general, the starting material is 99 alumina, free of impurities of a type and amount that would prevent conversion of the PCA body to sapphire. The magnesia content of the PCA body should be less than 100 wppm and preferably less than 50 wppm, we believe, to ensure that all of the magnesia is in solid solution with the alumina and not segregated at the grain boundaries where it would act to inhibit boundary mobility. The PCA body should have an equiaxed grain structure with average grain sizes less than 100 microns and preferably less than 70 microns. By grain size is meant the average dimension of a grain as measured by the well known linear intercept technique described in ASTM E112-88. PCA materials with average grain sizes larger than 100 µm tend to form microcracks during the heat treatment of this invention which prevents the conversion to sapphire. The density of the PCA should be at least 3.90 g/cc and more typically greater than 3.97 g/cc as the residual porosity can impede the conversion to sapphire and/or yield a sapphire product of less than optimal light transmittance.

In the experiments, the starting PCA material was Lucalox ® tubes which were heat treated to lower the magnesia content below 100 wppm and having outer diameters ranging from 4.5 mm to 8.8 mm with wall thicknesses ranging from 0.5 mm to 0.75 mm. Lucalox ® is available from General Electric Company, Willoughby Quartz and Ceramic Plant, Willoughby, Ohio. In other experiments, fibers with a diameter of approximately 0.015 inches were used. Lucalox ® material has an equiaxed grain structure and an average grain size ranging from 15–70 microns. Lucalox ® PCA is 99.99% alumina with typical densities ranging from 3.97 to 3.98 g/cc. A typical trace impurity analysis for Lucalox ® is given in Table 2. The 180 wppm concentration of magnesium (Mg) is equivalent to about 300 wppm magnesium oxide (MgO).

TABLE 2

| Trace Element | Si | Fe | Ca | Mg | K | Na | Li | Mo | Cr | Cu |
|---|---|---|---|---|---|---|---|---|---|---|
| WPPM Detected | 50 | 4 | 7 | 180 | 50 | 80 | <1 | 10 | 2 |  |

Figure 3:
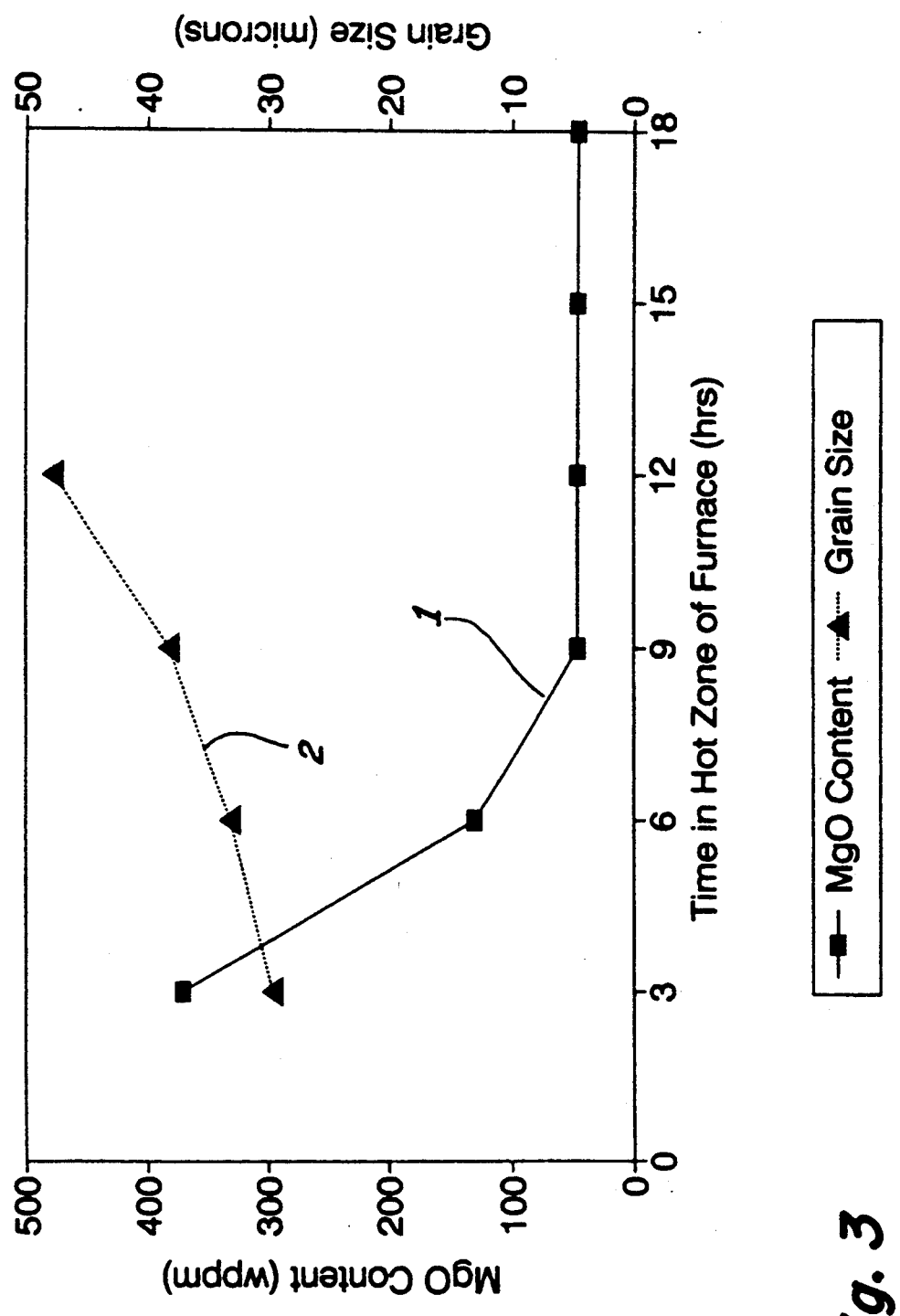
FIG. 3 is a graph showing the loss of magnesia in Lucalox ® tubing and the subsequent increase in average grain size as a function of heating time.

Because the magnesia level in Lucalox® PCA ranges from 300–400 wppm, steps were taken to lower the magnesia level below 100 wppm and still more preferably below 50 wppm, in order to obtain a starting material useful for the process of this invention. Those skilled in the art know that magnesia can be driven out of a PCA body by heating the body in a vacuum, dry hydrogen, or inert gas containing atmosphere to temperatures above 1600° C. To obtain the starting material used to prove the process of this invention, the Lucalox® was heated in an electric resistance furnace to temperatures of 1880° C. for approximately nine hours in an atmosphere of dry hydrogen having a dew point below 0° C. The material resulting from the heat treatment had a magnesia content of about 50 wppm. Magnesia content was determined using Inductively Coupled Plasma (ICP) analysis. Times required to drive magnesia from an alumina body will vary based on starting magnesia content, furnace temperature, furnace atmosphere and part dimensions. Care must be taken during the magnesia volatilization to avoid heating the material for too long as this can result in average grain sizes greater than 70 μm and/or anomalous grain growth. FIG. 3 shows an example of the increase in average grain size as a function of magnesia loss and heating time. Curve 1 in FIG. 3 illustrates the decrease in magnesia content as heating time is increased. Curve 2 in FIG. 3 illustrates the increase in grain size as the heating time is increased.

To convert the low magnesia dense starting material to sapphire, the starting material was heated in an electric resistance furnace in flowing dry hydrogen having a dew point less than 0° C. In one example the conversion into sapphire was done by passing the starting material in a continuous manner through the hot zone of the furnace which was at 1880° C. The time the material spent moving through the hot zone of the furnace ranged from 3–9 hours depending on the part geometry. In another example, the conversion was achieved by passing the starting material through the hot zone multiple times. Each pass through the furnace was done in a continuous manner. The hot zone temperature was 1880° C. and the time the sample spent in the hot zone during one pass was three hours. In another example, the conversion was carried out with the starting material remaining stationary in the hot zone of a hydrogen furnace having a dew point of less than about 0° C. and a temperature of about 1700° C. for 300 hours.

In all the above examples, 24 inch lengths of alumina tubing contained one or more regions of sapphire in excess of 6 inches long. Multiple regions of sapphire along the length of the tube result from crystal grown initiation from multiple sites along the tube.

Figure 2:
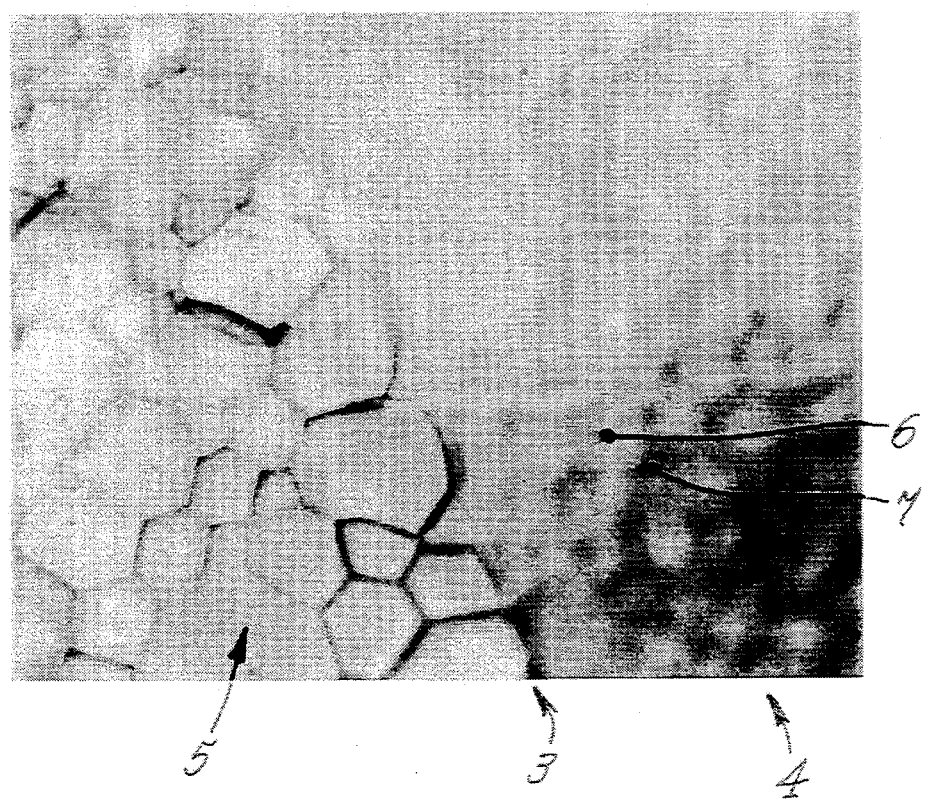
FIG. 2 is an optical micrograph showing the boundary between the sapphire and polycrystalline areas on the surface of an alumina tube heat treated according to the process of this invention and the surface topography on the sapphire surface.

Characterization of the sapphire material produced according to this invention was done using optical microscopy, scanning electron microscopy (SEM), four circle diffractometry, back reflection Laue and Precession Method X-ray techniques. Microscopic analysis showed the sapphire tubing produced by the process of the invention exhibited a topographical structure in the form of slight undulations, having high points 6 (as shown in FIG. 2) at approximately the midpoint of where each PCA grain was present prior to the conversion process and slight depressed areas 7 corresponding to former grain boundaries of the PCA material. FIG. 2 is an optical micrograph taken at 200× of the surface of an alumina tube showing a boundary 3 between a region of the alumina that has been converted to sapphire 4 and an area that remains polycrystalline 5. Grain boundaries are obvious in the polycrystalline region, but absent in the sapphire region. Topographical structure is evident in the sapphire region.

The lattice parameters of the crystal unit cell for the material produced by the process of the invention were determined using four circle diffractometry. The lattice parameters were found to be $a = 4.759$ Å and $c = 12.991$ Å which are in agreement with the published data of Lee and Lagerlof (J. Electron Microscopy Technique, 2:247–258, (1985)) for single crystal alpha alumina (sapphire). Back reflection Laue and Precession Method X-ray techniques were used to confirm that the sapphire regions produced by the process of the invention were single crystals. Both techniques confirmed that a constant orientation was maintained down the length of the region converted to sapphire.

Figure 1:
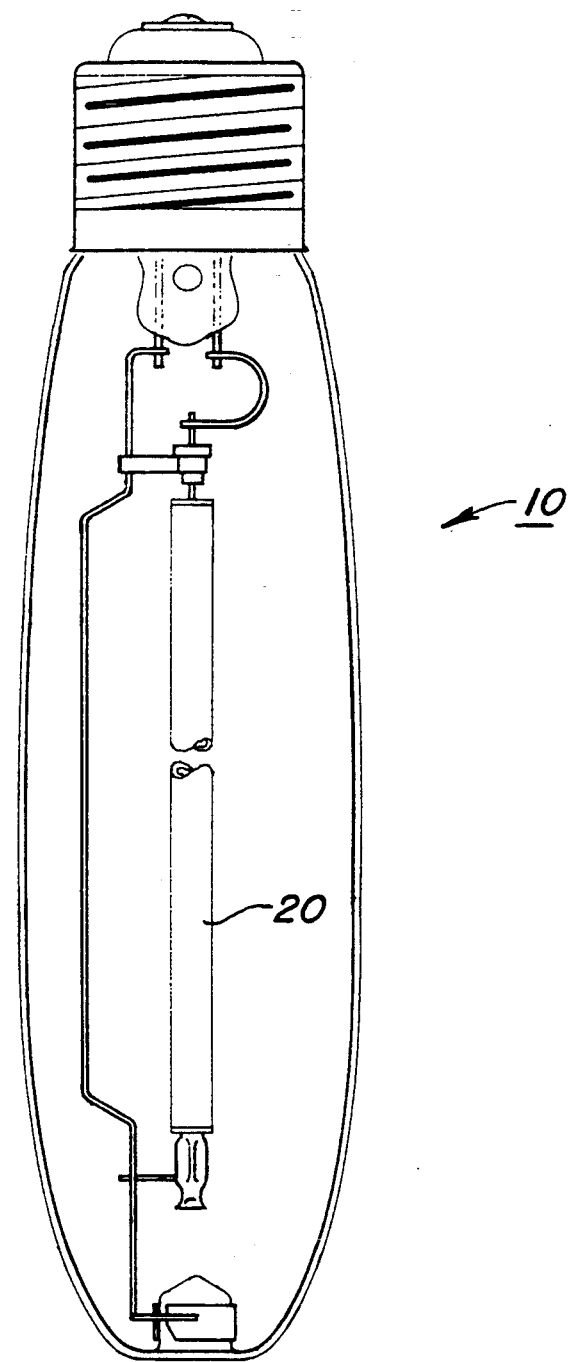
FIG. 1 schematically illustrates a high pressure sodium discharge lamp employing a sapphire arc tube made according to the process of this invention.

HPS lamps 10 (as shown in FIG. 1) were made having the general construction illustrated in the Figure with sapphire arc tubes 20 about 38 mm long with a 5 mm OD and 0.5 mm wall thickness. The sapphire was prepared from Lucalox® PCA tubing using the process of the invention set forth above. The arc tubes were dosed with about 16 mg of an amalgam of sodium and mercury which contained 17 wt. % sodium and a xenon gas at a pressure of 19 torr. Similar lamps were made with Lucalox® PCA arc tubes of the same dimensions and having the same fill. After 100 hours of operation at 50 watts the lamps having the Lucalox® arc tubes were emitting 76.1 lumens per watt while the lamps with the sapphire arc tubes made according to the invention were emitting 86.4 lumens per watt.

Seventy watt lamps were also made using the same construction with both sapphire arc tubes made according to the invention and also arc tubes made of Lucalox® PCA. The arc tubes were 41 mm long, with a 5.5 mm OD and a wall thickness of 0.5 mm and contained the same fill as the 50 watt lamps. After 100 hours of operation or burning time the lamps with the Lucalox® arc tubes were emitting 87.6 lumens per watt, whereas the lamps having the sapphire arc tubes made according to the practice of the invention were emitting 98.8 lumens per watt.

While we have shown and described particular embodiments of our invention, it is understood that various modifications will be apparent to and can be readily made by those skilled in the art without departing from the scope and spirit of the invention in its broader aspects. Thus, the use of the sapphire produced by the process of the invention for HPS lamp arc chambers is merely meant to be illustrative, but non-limiting, as those skilled in the art will know and appreciate. Accordingly, it is not intended that the scope of the claims appended hereto be limited to the description set forth above but rather that the claims be construed as encompassing all of the features of patentable novelty which reside in the present invention, including all features which would be treated as equivalents thereof by those skilled in the art to which the invention pertains. For example, suitable dense aluminas other than Lucalox® could be used in the practice of this invention. Such materials could be prepared from alumina powders and suitable dopants according to U.S. Pat. Nos. 3,026,210 and 4,150,317 and subsequently treated to remove excess magnesia. PCA prepared according to these processes, other commercially available PCAs or PCAs fabricated using processes that do not require magnesia doping (e.g., hot isostatic pressing), should provide suitable materials for this process provided they meet the requirements of purity, density, grain size and grain structure previously described. In addition, it should be apparent that this process for conversion of a polycrystalline body to a single crystal body should not be regarded as restricted to the conversion of PCA to sapphire, but that any polycrystalline body, if sufficiently pure and pore-free, can be converted to a single crystal form by heating below the melting temperature of the body, using the processes described above.

What is claimed is:

1. A solid state process for converting a dense polycrystalline alumina (PCA) body to a single crystal sapphire body comprising forming a PCA body precursor having greater than 300wppm MgO, densifying the precursor at a high temperature to create a body having a density of at least 3.9 g/cc, driving off the MgO to a level where it no longer inhibits boundary mobility, and heating said dense PCA body to temperatures above one-half of the melting temperature of said PCA but below the melting temperature of said PCA for a time sufficient to convert said PCA body to said sapphire body.

2. A process according to claim 1 wherein said dense polycrystalline alumina body contains grains having a relatively uniform grain size.

3. A process according to claim 1 wherein said dense polycrystalline alumina body does not contain any growth inhibitors in an amount that would prevent crystal growth during said heating.

4. A process according to claim 1 wherein said dense polycrystalline alumina body has been heat treated to lower the amount of grain growth inhibitors below the level that would prevent crystal growth prior to said conversion.

5. A process according to claim 1 wherein said heating to convert said dense polycrystalline alumina body to said sapphire body is accomplished by one thermal cycle.

6. A process according to claim 1 wherein said heating to convert said dense polycrystalline alumina body to said sapphire body is accomplished by more than one thermal cycle.

7. A solid state process for converting a dense polycrystalline alumina (PCA) body to a sapphire body comprising heating said dense PCA body, formed by densifying a precursor body containing greater than 300 wppm MgO, at a temperature above 1100° C. but below 2050° C. for a time sufficient to convert said PCA body to said sapphire body.

8. A process according to claim 7 wherein said dense PCA body has a density of at least 3.9 g/cc.

9. A process according to claim 7 wherein said dense PCA body has an average grain size ranging between 15 and 70 microns.

10. A process according to claim 7 wherein said dense PCA body comprises at least 99 wt. % alumina.

11. A process according to claim 7 wherein said dense PCA body does not contain any grain growth inhibitors in an amount which would prevent conversion to sapphire during said heating to convert the dense PCA body to sapphire.

12. A process according to claim 7 wherein said dense PCA body has been heat treated to lower the amount of grain growth inhibitors to a level below that which would prevent conversion to sapphire during said heating to convert the dense PCA body to sapphire.

13. A process according to claim 12 wherein said dense PCA body contains magnesia in an amount below 100 wppm.

14. A process according to claim 7 wherein said heating to convert said dense PCA body to said sapphire body is accomplished by one thermal cycle.

15. A process according to claim 7 wherein said heating to convert said dense PCA body to said sapphire body is accomplished by more than one thermal cycle.

16. A process according to claim 7 in which the dense PCA body is in the shape of a fiber.

17. A process according to claim 7 in which the dense PCA body is in the shape of a tube.

18. A solid state process for bulk conversion of a dense PCA body to sapphire wherein said dense PCA body comprises alumina having less than 50 wppm magnesia, a density in excess of 3.9 g/cc, a relatively uniform grain size, and an average grain size below 70 microns, said dense PCA body formed by densifying a precursor body containing greater than 300 wppm magnesia, said process comprising heating said PCA body at a temperature above 1700° C. but without melting said PCA body and for a time sufficient to convert said PCA body to sapphire.

19. A sapphire body converted from a polycrystalline alumina body and having a random pore structure and a surface texture in the form of undulations having high points where each grain of the PCA body was prior to solid state conversion to sapphire and depressions where each grain boundary of the PCA body was prior to solid state conversion to sapphire.

20. A sapphire body according to claim 19 in which the sapphire body is in the shape of a tube.

21. A sapphire body according to claim 19 in which the sapphire body is in the shape of a fiber.

22. In a discharge lamp having an arc tube, the improvement wherein said arc tube comprises sapphire converted from a polycrystalline alumina body (PCA) and having a random pore structure and a surface texture in the form of undulations having high points where each grain of the PCA body was prior to solid state conversion to sapphire and depressions where each grain boundary of the PCA body was prior to solid state conversion to sapphire.

* * * * *